(12) United States Patent
Huang

(10) Patent No.: US 8,368,425 B2
(45) Date of Patent: Feb. 5, 2013

(54) LEVEL SHIFTER

(75) Inventor: Chao-Sheng Huang, Taipei (TW)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/036,167

(22) Filed: Feb. 28, 2011

(65) Prior Publication Data

US 2012/0112790 A1    May 10, 2012

(30) Foreign Application Priority Data

Nov. 9, 2010 (CN) .......................... 2010 1 0539701

(51) Int. Cl.
H03K 19/0175 (2006.01)

(52) U.S. Cl. ............................. 326/81; 326/68; 327/333

(58) Field of Classification Search .................... 326/63, 326/68, 80–81; 327/333
See application file for complete search history.

(56) References Cited

U.S. PATENT DOCUMENTS

| | | | | |
|---|---|---|---|---|
| 4,450,371 A | * | 5/1984 | Bismarck | 326/17 |
| 4,532,436 A | * | 7/1985 | Bismarck | 327/208 |
| 5,781,026 A | * | 7/1998 | Chow | 326/26 |
| 5,821,800 A | * | 10/1998 | Le et al. | 327/333 |
| 6,373,315 B2 | * | 4/2002 | Tsuji et al. | 327/333 |
| 7,768,308 B2 | * | 8/2010 | Maede et al. | 326/68 |
| 2009/0243654 A1 | * | 10/2009 | Mori | 326/64 |
| 2010/0123505 A1 | * | 5/2010 | Chou et al. | 327/333 |

* cited by examiner

Primary Examiner — Jason M Crawford
(74) Attorney, Agent, or Firm — McClure, Qualey & Rodack, LLP

(57) ABSTRACT

A level shifter having first and second P-type transistors cross coupled at an output port thereof, wherein there are first and second voltage rising circuits coupled at gates of the first and second P-type transistors, respectively. A voltage level at the gate of the first P-type transistor is associated with an output signal of the level shifter. When an input signal, operated by a first power, of the level shifter rises, the first voltage rising circuit couples a second power to the gate of the first P-type transistor to speed up the rising of the output signal. The voltage level at the gate of the second P-type transistor is associated with an inverted output signal. When the input signal falls, the second voltage rising circuit couples the second power to the gate of the second P-type transistor to speed up the rising of the inverted output signal.

14 Claims, 2 Drawing Sheets

LEVEL SHIFTER

CROSS REFERENCE TO RELATED APPLICATIONS

This Application claims priority of Chinese Patent Application No. 201010539701.4, filed on Nov. 9, 2010, the entirety of which is incorporated by reference herein.

BACKGROUND OF THE INVENTION

1. Field of the Invention

The present invention relates to a level shifter.

2. Description of the Related Art

In modern integrated circuit (IC) design, the logical core and the input/output unit may be powered by distinct voltages.

For example, in an IC manufactured by a 0.13 um process technique, the logical core may be powered by a power of 1.2 volts while the input/output unit is powered by a power of 3.3 volts. Because signals of the logical core operate within a first voltage range (e.g. 0~1.2 volts) and signals of the input/output unit operate within a second voltage range (e.g. 0~3.3 volts), a level shifter is generally required to ensure that the signals conveyed between the logical core and the input/output unit are at correct logical states.

A level shifter with correct and rapid operation and a small size is called for.

BRIEF SUMMARY OF THE INVENTION

Level shifters are disclosed.

In one exemplary embodiment, the level shifter includes a first N-type transistor, a second N-type transistor, a first P-type transistor, a second P-type transistor, a first voltage rising circuit and a second voltage rising circuit.

The first and second N-type transistors form a differential input pair, wherein each provides a gate to receive an input signal and an inverted input signal individually, and each provides a source coupled to a ground level. The input signal and the inverted input signal are operated within a first voltage range associated with a first power.

The first and second P-type transistors are configured between a second power and the differential input pair, and are cross-coupled to each other to make the gates of the two P-type transistors operate within a second voltage range associated with a second power. The source of the first P-type transistor and the source of the second P-type transistor are both coupled to the second power. The drain of the first P-type transistor and the drain of the second P-type transistor are coupled to the drain of the first N-type transistor and the drain of the second N-type transistor, respectively. The gate of the first P-type transistor is coupled to the drain of the second P-type transistor while the gate of the second P-type transistor is coupled to the drain of the first P-type transistor.

The operation of the first voltage rising circuit will now be described. When the input signal changes from a first low voltage level of the first voltage range to a first high voltage level of the first voltage range, the first voltage rising circuit couples the second power to the gate of the first P-type transistor.

The operation of the second voltage rising circuit will now be described. When the input signal changes from the first high voltage level to the first low voltage level, the second voltage rising circuit couples the second power to the gate of the second P-type transistor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
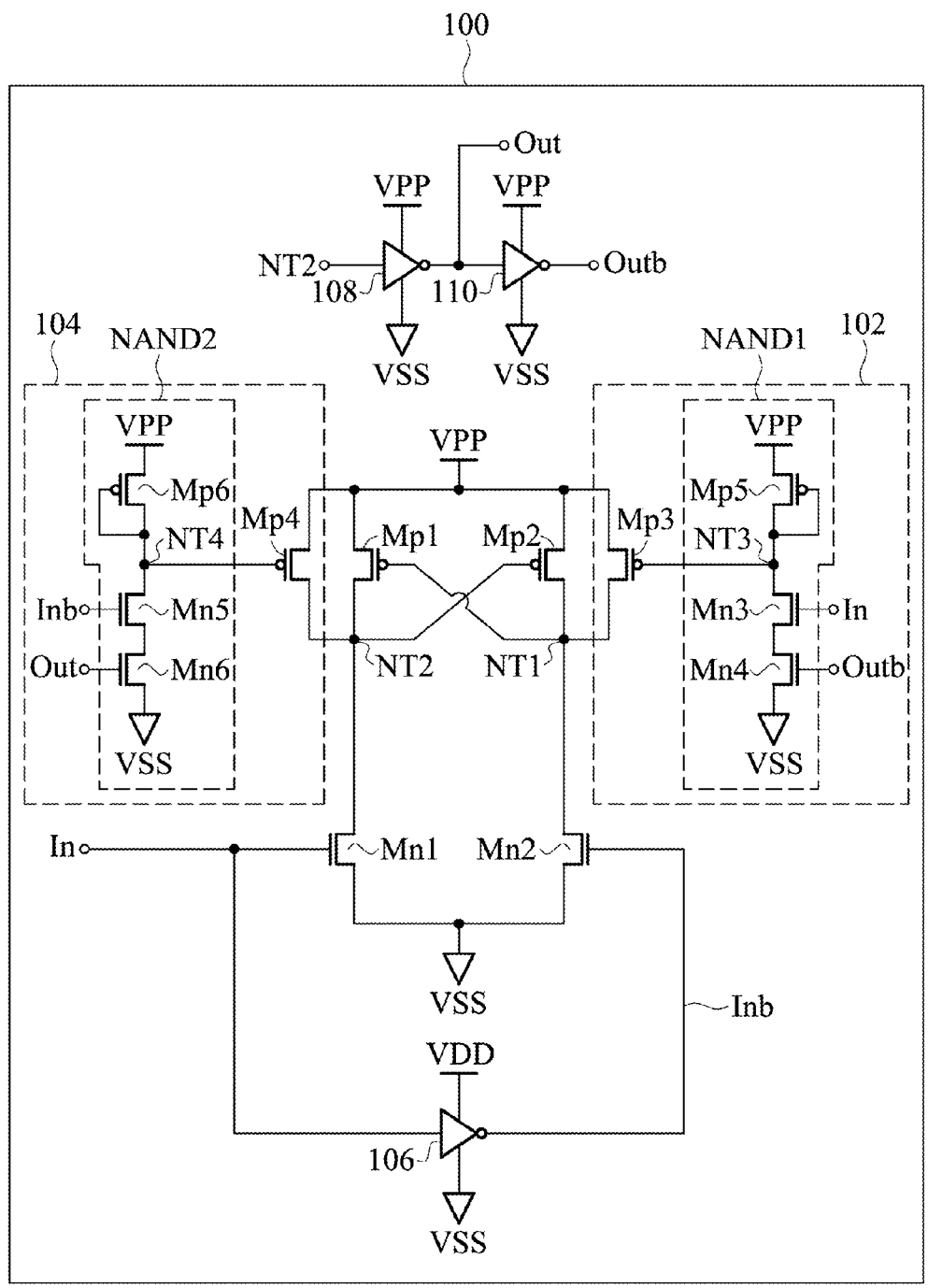
FIG. 1 depicts a level shifter in accordance with an exemplary embodiment of the invention.

FIG. 1 illustrates a level shifter according to an exemplary embodiment of the invention.

The level shifter 100 includes a first N-type transistor Mn1, a second N-type transistor Mn2, a first P-type transistor Mp1, a second P-type transistor Mp2, a first voltage rising circuit 102, a second voltage rising circuit 104 and three inverters 106, 108 and 110. The level shifter 100 shifts signals from a first voltage range to a wider one—a second voltage range. The first voltage range is associated with a first power (labeled by VDD). For example, the first voltage range may be from a ground level VSS to the voltage level of the first power VDD. The second voltage range is associated with a second power (labeled by VPP, greater than VDD). For example, the second voltage range may be from the ground level VSS to the voltage level of the second power VPP.

Configuration of the components of the level shifter 100 is detailed hereinafter.

The first and second N-type transistors Mn1 and Mn2 form a differential input pair. The gates of the first and second N-type transistors Mn1 and Mn2 receive an input signal (In) and an inverted input signal (Inb), respectively, and the sources of the first and second N-type transistors Mn1 and M2 are coupled to ground VSS. The input signal (In) and the inverted input signal (Inb) operate within the first voltage range. The inverter 106 is provided to invert the input signal (In) to generate the inverted input signal (Inb), and is powered by the first power VDD. The inverter 106 may be optional and may be selected by the user.

The first and second P-type transistors Mp1 and Mp2 are configured between the second power VPP and the differential input pair provided by the first and second N-type transistors Mn1 and Mn2, The first and second P-type transistors Mp1 and Mp2 are cross-coupled with each other to make the gate NT1 of the first P-type transistor Mp1 and the gate NT2 of the second P-type transistor Mp2 operate within the second voltage range. In the configuration shown in FIG. 2, the source of the first P-type transistor Mp1 and the source of the second P-type transistor Mp2 are both coupled to the second power VPP. The drain of the first P-type transistor Mp1 is coupled to the drain of the second N-type transistor Mn1, The drain of the second P-type transistor Mp2 is coupled to the drain of the second N-type transistor Mn2. The gate of the first P-type transistor Mp1 is coupled to the drain of the second P-type transistor Mp2. The gate of the second P-type transistor Mp2 is coupled to the drain of the first P-type transistor Mp1.

The voltage levels at the gates NT1 and NT2 of the first and second P-type transistors Mp1 and Mp2 may be further processed by buffers before being output. Referring to the embodiment shown in FIG. 1, the inverters 108 and 110 play the role of buffers and are powered by the second power VPP. The voltage level at the gate NT2 of the second P-type transistor Mp2 is inverted by the inverter 108 to generate the output signal Out of the level shifter 100. The inverter 110 further inverts the output signal Out to generate an inverted output signal Outb. The inverters 108 and 110 are optional devices and are chosen by the designer. In other embodiments, the buffers may be placed at the gate NT1 of the first P-type transistor Mp1 rather than the gate NT2 of the second P-type transistor Mp2.

The operation of the first voltage rising circuit 102 is discussed herein. When the input signal (In) changes from a first low voltage level (e.g. VSS) of the first voltage range to the first high voltage level (e.g. VDD) of the first voltage range, the first voltage rising circuit 102 couples the second power VPP to the gate NT1 of the first P-type transistor Mp1. Benefits of the design are described in the following. When the input signal (In) changes from the first low voltage level VSS to the first high voltage level VDD, the first N-type transistor Mn1 is turned on to couple the ground level VSS to the gate NT2 of the second P-type transistor Mp2. Thus, the second P-type transistor Mp2 is turned on to pull up the voltage level at the gate NT1 of the first P-type transistor Mp1. With the first voltage rising circuit 102, the voltage level at the gate NT1 rapidly rises. The first voltage rising circuit 102 helps the conducted second P-type transistor Mp2 to raise the voltage level at the gate NT1. In comparison with conventional techniques, the second P-type transistor Mp2 of the invention can be a small sized device.

The operation of the second voltage rising circuit 104 is discussed herein. When the input signal (In) changes from the first high voltage level (e.g. VDD) to the first low voltage level (e.g. VSS), the second voltage rising circuit 104 couples the second power VPP to the gate NT2 of the second P-type transistor Mp2. Benefits of the design are described in the following. When the input signal (In) changes from the first high voltage level VDD to the first low voltage level VSS, the inverted input signal (Inb) changes from the first low voltage level VSS to the first high voltage level VDD. In this manner, the second N-type transistor Mn2 is turned on to couple the ground level VSS to the gate NT1 of the first P-type transistor Mp1. Thus, the first P-type transistor Mp1 is turned on to pull up the voltage level at the gate NT2 of the second P-type transistor Mp2. With the second voltage rising circuit 104, the voltage level at the gate NT2 rapidly rises. The first voltage rising circuit 104 helps the conducted first P-type transistor Mp1 to raise the voltage level at the gate NT2. In comparison with conventional techniques, the first P-type transistor Mp1 of our invention can be a small size device.

The first and second voltage rising circuits 102 and 104 have various embodiments. The following discussion focuses on the structure introduced in FIG. 1. Note that the voltage rising circuits 102 and 104 shown in FIG. 1 are just for explanation and are not intended to limit the configuration of the voltage rising circuit.

Referring to the first voltage rising circuit 102, there is a third P-type transistor Mp3 and a first NAND gate NAND1. The third P-type transistor Mp3 has a source coupled to the second power VPP, and a drain coupled to the gate NT1 of the first P-type transistor Mp1. The first NAND gate NAND1 receives the input signal (In) and a first signal (e.g. the inverted output signal Outb) and outputs the logical result to control a gate NT3 of the third P-type transistor Mp3. In this manner, when the input signal (In) changes from the first low voltage level VSS to the first high voltage level VDD, but the inverted output signal Outb is still a second high voltage level (e.g. VPP) and does not change yet to a second low voltage level (e.g. VSS), the first NAND gate NAND1 outputs a low voltage level signal to the gate NT3 of the third P-type transistor Mp3. The third P-type transistor Mp3 is turned on accordingly to couple the second power VPP to the gate NT1 of the first P-type transistor Mp1, so that the voltage level at the gate NT1 is pulled up rapidly.

In some embodiments, the first signal may be implemented by other signals rather than the inverted output signal Outb. For example, the voltage level at the gate NT2 of the second P-type transistor Mp2 may be used as the first signal, or, the voltage level at the gate NT2 of the second P-type transistor Mp2 may be further processed by an even number of inverters (e.g. the two inverters 108 and 110) to generate the first signal, or, the voltage level at the gate NT1 of the first P-type transistor Mp1 may be inverted by an odd number of inverters to generate the first signal.

Referring to the second voltage rising circuit 104, there is a fourth P-type transistor Mp4 and a second NAND gate NAND2. The fourth P-type transistor Mp4 has a source coupled to the second power VPP, and has a drain coupled to the gate NT2 of the second P-type transistor Mp2. The second NAND gate NAND2 receives the inverted input signal (Inb) and a second signal (e.g. the output signal Out) and outputs the logical result to control a gate NT4 of the fourth P-type transistor Mp4. In this manner, when the inverted input signal (Inb) changes from the first low voltage level VSS to the first high voltage level VDD, but the output signal Out is still at the second high voltage level and does not yet change to the second low voltage level VSS, the second NAND gate NAND2 outputs a low voltage level signal to the gate NT4 of the fourth P-type transistor Mp4. The fourth P-type transistor Mp4 is turned on accordingly to couple the second power VPP to the gate NT2 of the second P-type transistor Mp2, so that the voltage level at the gate NT2 is pulled up rapidly.

In some embodiments, the second signal may be implemented by other signals rather than the output signal Out. For example, the voltage level at the gate NT1 of the first P-type transistor Mp1 may be used as the second signal, or, the voltage level at the gate NT1 of the first P-type transistor Mp1 may be further processed by an even number of inverters to generate the second signal, or, the voltage level at the gate NT2 of the second P-type transistor Mp2 may be inverted by an odd number of inverters (e.g. the inverter 108) to generate the second signal.

This paragraph discusses the configuration of the first NAND gate NAND1.

The first NAND gate NAND1 includes a third N-type transistor Mn3, a fourth N-type transistor Mn4 and a fifth P-type transistor Mp5. The third and the fourth N-type transistors Mn3 and Mn4 are coupled in series between the gate NT3 of the third P-type transistor Mp3 and the ground VSS. The gate of the third N-type transistor Mn3 receives the input signal (In). The gate of the fourth N-type transistor Mn4 receives the first signal (e.g. the inverted output signal Outb). The fifth P-type transistor Mp5 is configured as a diode, and is operative to couple the second power VPP to the gate NT3 of the third P-type transistor Mp3. When the third and the fourth N-type transistors Mn3 and Mn4 are not turned on, the gate NT3 of the third P-type transistor Mp3 is coupled to the second power VPP via the fifth P-type transistor Mp5 which is diode-connected. Thus, the gate NT3 of the third P-type transistor Mp3 is kept at a high voltage level and the third P-type transistor Mp3 is maintained off and current leakage is effectively reduced.

This paragraph discusses the configuration of the second NAND gate NAND2. The second NAND gate NAND2 includes a fifth N-type transistor Mn5, a sixth N-type transistor Mn6 and a sixth P-type transistor Mp6. The fifth and the sixth N-type transistors Mn5 and Mn6 are coupled in series between the gate NT4 of the fourth P-type transistor Mp4 and the ground VSS. The gate of the fifth N-type transistor Mn5 receives the inverted input signal (Inb). The gate of the sixth N-type transistor Mn6 receives the second signal (e.g. the output signal Out). The sixth P-type transistor Mp6 is configured as a diode, and is operative to couple the second power VPP to the gate NT4 of the fourth P-type transistor Mp4. When the fifth and the sixth N-type transistors Mn5 and Mn6 are not turned on, the gate NT4 of the fourth P-type transistor Mp4 is coupled to the second power VPP via the sixth P-type transistor Mp6 which is diode-connected. Thus, the gate NT4 of the fourth P-type transistor Mp4 is kept at a high voltage level and the fourth P-type transistor Mp4 is maintained off and current leakage is effectively reduced.

Figure 2:
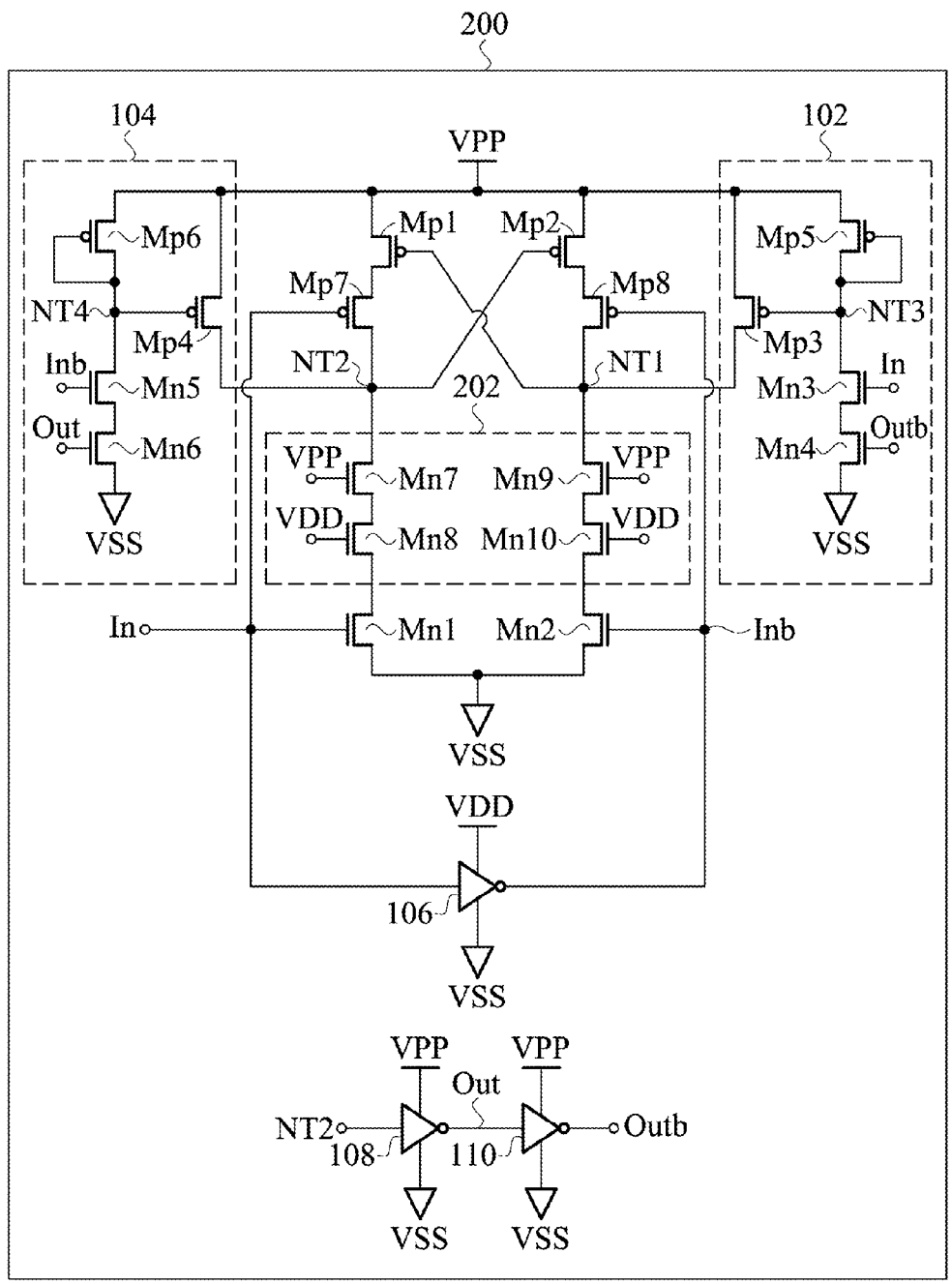
FIG. 2 depicts another exemplary embodiment of the level shifter.

FIG. 2 depicts another embodiment of the level shifter. In comparison with the level shifter 100 of FIG. 1, the level shifter 200 further includes a voltage drop circuit 202 and an isolation circuit (including a seventh and an eighth P-type transistor Mp7 and Mp8).

This paragraph discusses the voltage drop circuit 202. In this embodiment, there are seventh and eighth N-type transistors Mn7 and Mn8 coupled in series between the gate NT2 of the second P-type transistor Mp2 and the drain of the first N-type transistor Mn1, and there are ninth and tenth N-type transistors Mn9 and Mn10, coupled in series, between the gate NT1 of the first P-type transistor Mp1 and the drain of the second N-type transistor Mn2. The gate oxide of the eighth and the tenth N-type transistors Mn8 and Mn10 is thinner than that of the seventh and the ninth N-type transistors Mn7 and Mn9. The gates of the eighth and the tenth N-type transistors Mn8 and Mn10 are coupled to the first power VDD while the gates of the seventh and the ninth N-type transistors Mn7 and Mn9 are coupled to the second power VPP. When the first N-type transistor Mn1 is turned off, the seventh and the eighth N-type transistors Mn7 and Mn8 provide a first voltage drop between the gate NT2 of the second P-type transistor Mp2 and the drain of the first N-type transistor Mn1. In this manner, a limited voltage drop is applied on the first N-type transistor Mn1, so that the first N-type transistor Mn1 can be realized by a thin-oxide (in comparison with conventional techniques). Because it is easy to drive thin-oxide devices, the operation speed of the whole level shifter is improved. In another case wherein the second N-type transistor Mn2 is turned off, the ninth and the tenth N-type transistors Mn9 and Mn10 provide a second voltage drop between the gate NT1 of the first P-type transistor Mp1 and the drain of the second N-type transistor Mn2. In this manner, a limited voltage drop is applied on the second N-type transistor Mn2, so that the second N-type transistor Mn2 can be realized by a thin-oxide (in comparison with conventional techniques). Because it is easy to drive thin-oxide device, the operation speed of the whole level shifter is improved. In the level shifter 200, the first, the second, the eighth and the tenth N-type transistors Mn1, Mn2, Mn8 and Mn10 may be manufactured by a thin oxide while the other transistors are manufactured by a thick oxide.

This paragraph discusses the isolation circuit. The isolation circuit includes a seventh P-type transistor Mp7 which has a source coupled to the drain of the first P-type transistor Mp1, a drain coupled to the gate NT2 of the second P-type transistor Mp2, and a gate controlled by the input signal (In). The seventh P-type transistor Mp7 mitigates the competition between the first N-type transistor Mn1 and the first P-type transistor Mp1. In addition to the seventh P-type transistor Mp7, the isolation circuit further includes an eighth P-type transistor Mp8 which has a source coupled to the drain of the second P-type transistor Mp2, a drain coupled to the gate NT1 of the first P-type transistor Mp1, and a gate controlled by the inverted input signal (Inb). The eighth P-type transistor Mp8 mitigates the competition between the second N-type transistor Mn2 and the second P-type transistor Mp2.

In FIG. 2, the level shifter includes both of the voltage drop circuit 202 and the isolation circuit (including transistors Mp7 and Mp8). However, in other embodiments, a level shifter may only include the voltage drop circuit 202 or only include the isolation circuit (including transistors Mp7 and Mp8).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
a first N-type transistor and a second N-type transistor, forming a differential input pair, wherein a gate of the first N-type transistor and a gate of the second N-type transistor receive an input signal and an inverted input signal, respectively, and a source of the first N-type transistor and a source of the second N-type transistor are coupled to ground, and wherein the input signal and the inverted input signal are operated within a first voltage range associated with a first power;
a first P-type transistor and a second P-type transistor, configured between a second power and the differential input pair and cross-coupled to each other to make a gate of the first P-type transistor and a gate of the second P-type transistor operate within a second voltage range associated with the second power, wherein a source of the first P-type transistor and a source of the second P-type transistor are both coupled to the second power, a drain of the first P-type transistor and a drain of the second P-type transistor are coupled to a drain of the first N-type transistor and a drain of the second N-type transistor, respectively, the gate of the first P-type transistor is coupled to the drain of the second P-type transistor, and the gate of the second P-type transistor is coupled to the drain of the first P-type transistor;
a first voltage rising circuit, coupling the second power to the gate of the first P-type transistor when the input signal changes from a first low voltage level of the first voltage range to a first high voltage level of the first voltage range; and
a second voltage rising circuit, coupling the second power to the gate of the second P-type transistor when the input signal changes from the first high voltage level to the first low voltage level,
wherein, the first voltage rising circuit comprises:
a third P-type transistor, having a source coupled to the second power, a drain coupled to the gate of the first P-type transistor, and a gate; and a first NAND gate, receiving the input signal and a first signal, and generating an output to control the gate of the third P-type transistor, wherein:

the first signal is a voltage level at the gate of the second P-type transistor, or is generated by inverting the voltage level at the gate of the second P-type transistor by an even number of inverters, or is generated by inverting a voltage level at the gate of the first P-type transistor by an odd number of inverters; and the first NAND gate comprises a third N-type transistor and a fourth N-type transistor, wherein the third and fourth N-type transistors are coupled in series between the gate of the third P-type transistor and the ground, a gate of the third N-type transistor is operative to receive the input signal while a gate of the fourth N-type transistor is operative to receive the first signal.

2. The level shifter as claimed in claim 1, wherein the second voltage rising circuit comprises:

a fourth P-type transistor, having a source coupled to the second power, a drain coupled to the gate of the second P-type transistor, and a gate; and a second NAND gate, receiving the inverted input signal and a second signal, and generating an output to control the gate of the fourth P-type transistor, wherein the second signal is a voltage level at the gate of the first P-type transistor, or is generated by inverting the voltage level at the gate of the first P-type transistor by an even number of inverters, or is generated by inverting a voltage level at the gate of the second P-type transistor by an odd number of inverters.

3. The level shifter as claimed in claim 2, wherein the second NAND gate comprises:

a fifth N-type transistor and a sixth N-type transistor coupled in series between the gate of the fourth P-type transistor and the ground, wherein a gate of the fifth N-type transistor is operative to receive the inverted input signal while a gate of the sixth N-type transistor is operative to receive the second signal.

4. The level shifter as claimed in claim 3, wherein the second NAND gate further comprises:

a diode-connected sixth P-type transistor, coupled from the second power to the gate of the fourth P-type transistor.

5. The level shifter as claimed in claim 1, wherein the first NAND gate further comprises:

a diode-connected fifth P-type transistor, coupled from the second power to the gate of the third P-type transistor.

6. The level shifter as claimed in claim 1, further comprising:

a voltage drop circuit, generating a first voltage drop between the gate of the second P-type transistor and the drain of the first N-type transistor when the first N-type transistor is turned off, and generating a second voltage drop between the gate of the first P-type transistor and the drain of the second N-type transistor when the second N-type transistor is turned off.

7. The level shifter as claimed in claim 6, wherein gate oxide of the first and second N-type transistors is thinner than that of the first and second P-type transistors.

8. A level shifter, comprising:

a differential input pair receiving an input signal and an inverted input signal operated within a first voltage range associated with a first power;

a cross-coupled pair, configured between a second power and the differential input pair to provide an output signal and an inverted output signal operated within a second voltage range associated with the second power; and a voltage rising pair, coupled to the cross-coupled pair to speed up a rising speed of the output signal and a rising speed of the inverted output signal, wherein the voltage rising pair comprises:

a first voltage rising circuit, using the second power to speed up the rising speed of the output signal when the input signal changes from a first low voltage level of the first voltage range to a first high voltage level of the first voltage range; and a second voltage rising circuit, using the second power to speed up the rising speed of the inverted output signal when the input signal changes from the first high voltage level to the first low voltage level, wherein the first voltage rising circuit comprises:

a third P-type transistor, having a source coupled to the second power, a drain operative to affect the output signal, and a gate; and a first NAND gate, receiving the input signal and a first signal, and generating an output to control the gate of the third P-type transistor, wherein the first NAND gate comprises a third N-type transistor and a fourth N-type transistor, wherein the third and fourth N-type transistors are coupled in series between the gate of the third P-type transistor and ground, a gate of the third N-type transistor is operative to receive the input signal while a gate of the fourth N-type transistor is operative to receive the first signal.

9. The level shifter as claimed in claim 8, wherein:

the differential input pair comprises:

a first N-type transistor, having a gate receiving the input signal, a source coupled to ground, and a drain; and a second N-type transistor, having a gate receiving the inverted input signal, a source coupled to the ground, and a drain; and the cross-coupled pair comprises:

a first P-type transistor, having a source coupled to the second power, a drain coupled to the drain of first N-type transistor, and a gate; and a second P-type transistor, having a source coupled to the second power, a drain coupled to the drain of the second N-type transistor and the gate of the first P-type transistor, and a gate coupled to the drain of the first P-type transistor.

10. The level shifter as claimed in claim 9, further comprising an isolation circuit, wherein the isolation circuit comprises:

a seventh P-type transistor, having a source coupled to the drain of the first P-type transistor, a drain coupled to the drain of the first N-type transistor, and a gate controlled by the input signal; and an eighth P-type transistor, having a source coupled to the drain of the second P-type transistor, a drain coupled the drain of the second N-type transistor, and a gate controlled by the inverted input signal.

11. The level shifter as claimed in claim 8, wherein the second voltage rising circuit comprises:

a fourth P-type transistor, having a source coupled to the second power, a drain operative to affect the inverted output signal, and a gate; and a second NAND gate, receiving the inverted input signal and a second signal, and generating an output to control the gate of the fourth P-type transistor, wherein the second signal represents a state of the output signal.

12. The level shifter as claimed in claim 11, wherein the second NAND gate comprises:
   a fifth N-type transistor and a sixth N-type transistor coupled in series between the gate of the fourth P-type transistor and the ground, wherein a gate of the fifth N-type transistor is operative to receive the inverted input signal while a gate of the sixth N-type transistor is operative to receive the second signal.

13. The level shifter as claimed in claim 12, wherein the second NAND gate further comprises:
   a diode-connected sixth P-type transistor, coupled from the second power to the gate of the fourth P-type transistor.

14. The level shifter as claimed in claim 8, wherein the first NAND gate further comprises:
   a diode-connected fifth P-type transistor, coupled from the second power to the gate of the third P-type transistor.

* * * * *